US010114775B2

(12) United States Patent
Best

(10) Patent No.: US 10,114,775 B2
(45) Date of Patent: Oct. 30, 2018

(54) STACKED SEMICONDUCTOR DEVICE ASSEMBLY IN COMPUTER SYSTEM

(71) Applicant: Rambus Inc., Sunnyvale, CA (US)

(72) Inventor: Scott C. Best, Palo Alto, CA (US)

(73) Assignee: RAMBUS INC., Sunnyvale, CA (US)

( * ) Notice: Subject to any disclaimer, the term of this patent is extended or adjusted under 35 U.S.C. 154(b) by 112 days.

(21) Appl. No.: 15/277,949

(22) Filed: Sep. 27, 2016

(65) Prior Publication Data
US 2017/0017594 A1 Jan. 19, 2017

Related U.S. Application Data

(63) Continuation of application No. 14/885,173, filed on Oct. 16, 2015, now Pat. No. 9,880,959, which is a
(Continued)

(51) Int. Cl.
*G06F 13/362* (2006.01)
*H01L 23/60* (2006.01)
(Continued)

(52) U.S. Cl.
CPC ........ *G06F 13/362* (2013.01); *G06F 13/4068* (2013.01); *G11C 11/408* (2013.01);
(Continued)

(58) Field of Classification Search
CPC .... G06F 13/362; G06F 13/40; G06F 13/4068; H01L 27/02; H01L 25/0652;
(Continued)

(56) References Cited

U.S. PATENT DOCUMENTS 5,373,189 A 12/1994 Massit et al.
5,473,635 A 12/1995 Chevroulet
(Continued)

FOREIGN PATENT DOCUMENTS

WO WO-2010-138480 A2 12/2010
WO WO-2011-049710 A2 4/2011
WO WO-2013-025205 A1 2/2013

OTHER PUBLICATIONS

Amir et al., "3D Packaging, Interconnection & Assembly," 2013 Slidedeck downloaded from http://www.smta.org/chapters/files/Oregon_3D_Packaging_SMTA_CTP_2013_(Version_C).pdf. 196 pages.
(Continued)

Primary Examiner — Henry Tsai
Assistant Examiner — Christopher A Daley
(74) Attorney, Agent, or Firm — Morgan, Lewis & Bockius LLP

(57) ABSTRACT

This application is directed to a stacked semiconductor device assembly including first and second integrated circuit (IC) devices. Each of the first and second IC devices further includes a master interface, a channel master circuit configured to receive read/write data using the master interface, a slave interface, a channel slave circuit configured to receive read/write data using the slave interface, a memory core coupled to the channel salve circuit, and a modal pad. The first and second IC devices are configured such that in response to at least a modal selection signal received at one of the modal pads of the first and second IC devices, one of the first and second IC devices is configured to receive read/write data using its respective charnel master circuit, and the other of the first and second IC devices is configured to receive read/write data using its respective channel slave circuit.

22 Claims, 9 Drawing Sheets

Related U.S. Application Data continuation of application No. 13/321,121, filed as application No. PCT/US2010/036020 on May 25, 2010, now Pat. No. 9,171,824.

(60) Provisional application No. 61/181,251, filed on May 26, 2009.

(51) Int. Cl.

| | |
|---|---|
| *H01L 25/065* | (2006.01) |
| *G11C 11/408* | (2006.01) |
| *G11C 11/409* | (2006.01) |
| *H01L 23/50* | (2006.01) |
| *H01L 23/00* | (2006.01) |
| *G06F 13/40* | (2006.01) |
| *G11C 11/4096* | (2006.01) |
| *G11C 14/00* | (2006.01) |
| *G11C 16/10* | (2006.01) |
| *G11C 16/26* | (2006.01) |
| *H01L 27/02* | (2006.01) |
| *H01L 23/48* | (2006.01) |

(52) U.S. Cl.
CPC ........ *G11C 11/409* (2013.01); *G11C 11/4096* (2013.01); *G11C 14/0018* (2013.01); *G11C 16/10* (2013.01); *G11C 16/26* (2013.01); *H01L 23/481* (2013.01); *H01L 23/50* (2013.01); *H01L 23/60* (2013.01); *H01L 24/09* (2013.01); *H01L 25/0652* (2013.01); *H01L 25/0657* (2013.01); *H01L 27/0248* (2013.01); *H01L 23/48* (2013.01); *H01L 2224/0401* (2013.01); *H01L 2224/0557* (2013.01); *H01L 2224/06181* (2013.01); *H01L 2224/08145* (2013.01); *H01L 2224/16145* (2013.01); *H01L 2224/16225* (2013.01); *H01L 2225/06503* (2013.01); *H01L 2225/06513* (2013.01); *H01L 2225/06527* (2013.01); *H01L 2225/06541* (2013.01); *H01L 2225/06544* (2013.01); *H01L 2225/06555* (2013.01); *H01L 2225/06562* (2013.01); *H01L 2924/0002* (2013.01); *H01L 2924/00014* (2013.01); *H01L 2924/14* (2013.01); *H01L 2924/1436* (2013.01); *H01L 2924/15311* (2013.01)

(58) Field of Classification Search
CPC ........ H01L 25/0657; H01L 2224/0557; H01L 2224/06181; H01L 2225/06513; H01L 2225/06541; H01L 2225/06562; H01L 2224/16145; H01L 2224/16225; H01L 2924/15311; H01L 2924/00014; H01L 2224/0401; H01L 23/50; H01L 24/09; H01L 2224/08145; H01L 2924/1436; H01L 2924/14; H01L 27/0248; G11C 11/408; G11C 16/10

See application file for complete search history.

(56) References Cited

U.S. PATENT DOCUMENTS

| | | | |
|---|---|---|---|
| 6,141,245 A | 10/2000 | Bertin et al. | |
| 6,392,292 B1 | 5/2002 | Morishita | |
| 6,586,266 B1 * | 7/2003 | Lin | G01R 31/2884 257/E21.705 |
| 7,352,602 B2 | 4/2008 | Janzen | |
| 7,400,047 B2 * | 7/2008 | Gabara | H01L 23/50 257/685 |
| 7,468,551 B2 * | 12/2008 | Lin | H01L 25/0657 257/202 |
| 7,535,105 B2 | 5/2009 | Voldman | |
| 7,816,776 B2 | 10/2010 | Choi | |
| 7,868,454 B2 * | 1/2011 | Lin | G01R 31/31905 257/738 |
| 7,898,834 B2 | 3/2011 | Kim et al. | |
| 7,919,873 B2 * | 4/2011 | Lee | H01L 21/563 257/778 |
| 8,258,619 B2 | 9/2012 | Foster, Sr. et al. | |
| 8,432,027 B2 * | 4/2013 | Foster, Sr. | H01L 25/0657 257/686 |
| 8,436,477 B2 | 5/2013 | Crisp et al. | |
| 8,513,817 B2 | 8/2013 | Haba et al. | |
| 8,558,353 B2 * | 10/2013 | Salzman | H01L 23/49816 257/621 |
| 8,823,162 B2 | 9/2014 | Foster, Sr. et al. | |
| 9,171,824 B2 | 10/2015 | Best | |
| 2004/0232559 A1 | 11/2004 | Adelmann | |
| 2005/0082664 A1 | 4/2005 | Funaba et al. | |
| 2005/0121802 A1 | 6/2005 | Kawano et al. | |
| 2006/0226529 A1 | 10/2006 | Kato et al. | |
| 2007/0029646 A1 | 2/2007 | Voldman | |
| 2007/0057384 A1 | 3/2007 | Alam et al. | |
| 2007/0096332 A1 | 5/2007 | Satoh et al. | |
| 2007/0228546 A1 | 10/2007 | So et al. | |
| 2007/0246257 A1 | 10/2007 | Muff et al. | |
| 2008/0055957 A1 | 3/2008 | Zhang | |
| 2008/0088031 A1 | 4/2008 | Kwon et al. | |
| 2008/0185586 A1 | 8/2008 | Lin | |
| 2008/0237891 A1 | 10/2008 | Irsigler et al. | |
| 2010/0289131 A1 | 11/2010 | Bathan et al. | |
| 2010/0314772 A1 | 12/2010 | Lee | |
| 2011/0050320 A1 | 3/2011 | Gillingham | |
| 2011/0108972 A1 | 5/2011 | Foster, Sr. et al. | |
| 2017/0115893 A1 * | 4/2017 | Jeddeloh | G06F 3/0611 |

OTHER PUBLICATIONS

Article 34 Amendment dated Mar. 28, 2011 re Int'l. Application No. PCT/US2010/036020, 9 Pages.

Best, Scott re U.S. Appl. No. 12/321,121, filed Nov. 17, 2011 re Information Disclosure Statement dated Nov. 17, 2011, 5 Pages.

Best, Scott re U.S. Appl. No. 12/321,121, filed Nov. 17, 2011 re Preliminary Amendment dated Nov. 17, 2011. 7 Pages.

International Preliminary Report on Patentability dated May 17, 2012 re Int'l Application No. PCT/US10/036020. 4 pages.

International Search report and Written Opinion dated Nov. 22, 2010 re Int'l Application No. PCT/US2010/036020. 20 Pages.

Kang, Uksong et al., "8Gb 3D DDR3 DRAM Using Through-Silicon-Via Technology," IEEE International Solid-State Circuits Conference, 2009. 3 pages.

Kawano, Masaya et al., "Three-Dimensional Packaging Technology for Stacked DRAM With 3-Gb/s Data Transfer", IEEE Transactions on Electron Devices, vol. 55, No. 7 Jul. 2008, p. 1614-1620. 7 Pages.

Supplemental Amendment submitted Feb. 10, 2012 re Intl' Application No. PCT/US2010/036020. 9 pages.

\* cited by examiner

STACKED SEMICONDUCTOR DEVICE ASSEMBLY IN COMPUTER SYSTEM

CROSS REFERENCE TO RELATED APPLICATIONS

This Application is a continuation of U.S. patent application Ser. No. 14/885,173, filed on Oct. 16, 2015, which is a continuation of U.S. patent application Ser. No. 13/321,121, filed on Nov. 17, 2011, which is a United States National Stage Application filed under 35 U.S.C. § 371 of PCT Patent Application Serial, No. PCT/US2010/036020 filed on May 25, 2010, which claims the benefit of and priority to U.S. Provisional Patent Application Ser. No. 61/181,251 filed on May 26, 2009, all of which are hereby incorporated by reference in their entireties.

TECHNICAL FIELD

The embodiments disclosed herein relate to semiconductor devices, and in particular to a stacked semiconductor device assembly with at least one of the semiconductor devices offset from the remainder of the semiconductor devices.

BACKGROUND

As computer systems evolve, so does the demand for increased memory for such systems. To increase memory density, some memory packages consist of several integrated circuit (IC) dies stacked one on top of the other. These stacked multi-die packages increase the capacity of each memory device without requiring additional space on the underlying circuit board or memory module. Furthermore, Thru-Silicon Via (TSV) technology is emerging as a popular solution for enabling the largest number of die-to-die interconnect in multi-die packages.

There are, however, a number of drawbacks associated with stacked multi-die packages, especially when TSV's are used as the interconnection means. For one, it is often desirable from a manufacturing cost perspective that all of the dies in the stack are derived from the same mask set, i.e., that all of the dies in a stack are substantially identical. When identical dies are stacked in a package and interconnected by TSV's, however, it is often difficult to selectively enable different modes of operation to a subset of the dies within the stack. For example, if the TSV's interconnect the stacked devices at the input/output ("IO") pad of each die, there will be a large aggregation of capacitance at that point. In particular, each die contributes capacitance associated with that die's IO pad metal, IO device loading, IO devices, and electrostatic discharge (ESD) device loading. With such a large aggregated capacitance, the stack of die would become severely limited in operational speed compared to one of the die on its own.

In other stacked multi-die packages, the TSV's may interconnect the stacked dies internally, "behind" the IO system, using some sort of multi-drop data bus topology. In these packages, one of the dies acts as the "bus master", while others act as "slave devices." If the dies are substantially identical, it is difficult to designate one of the devices as the "bus master" without utilizing bus-multiplexing circuitry that is non-optimal from a cost and performance perspective.

In yet other stacked multi-die packages, it may be possible to add one or more manufacturing steps to modify some features or connections on some of the devices to facilitate die stacking. Performing such modifications, however, adds significant manufacturing and inventory control costs. As a result, the complexity and manufacturing and assembly costs for the stacked semiconductor device assembly are increased substantially.

As such it would be highly desirable to provide a stacked die assembly that utilizes substantially identical dies and that enables selective modes of operation for at least a subset of the dies in the stack.

BRIEF DESCRIPTION OF THE DRAWINGS

For a better understanding of the disclosure herein, reference should be made to the following detailed description taken in conjunction with the accompanying drawings, in which.

Like reference numerals refer to the same or similar components throughout the several views of the drawings.

DETAILED DESCRIPTION OF THE EMBODIMENTS

Figure 1A:
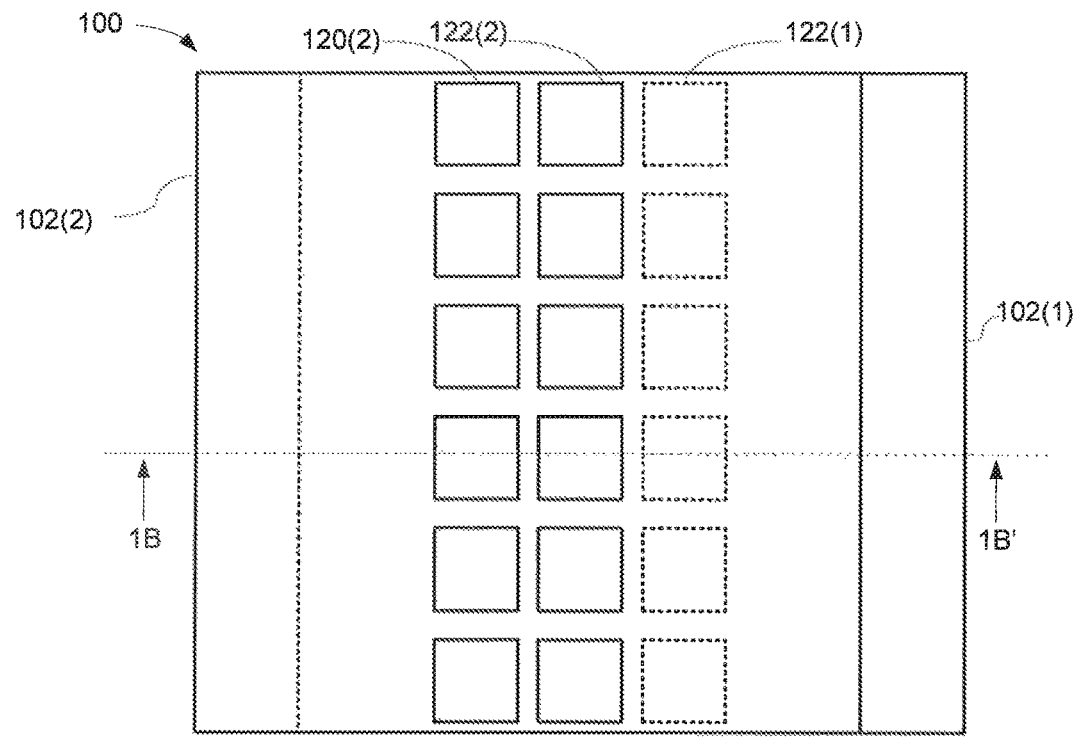
FIG. 1A is a plan view of an exemplary stacked semiconductor device assembly.

The following describes a number of exemplary assemblies that address the issues associated with multiple semiconductor devices being stacked together to form a semiconductor packaging assembly (or package), in which at least one semiconductor device in the stack performs different functions or electrical operations as compared to the other devices in the stack. Stated differently, an interface semiconductor device, while being substantially identical to the other devices in the assembly, performs different functions from those preformed, by the other semiconductor devices in the stack; or the interface semiconductor device operates in a different mode of operation from the mode of operation of the other devices. In one embodiment, the interface device connects to circuitry external to the stacked semiconductor device assembly, and is conveniently placed at the bottom of the stack of semiconductor devices in the assembly. For example, the interface semiconductor device may include all of the active external-IO circuitry (such as the ESD circuitry), while the remainder of the semiconductor device in the stack have lower-power "intra-stack" IO circuitry. In another example, the interface device may perform master read/write operations while the other devices perform slave read/write operations.

According to some embodiments there is provided a semiconductor device assembly that includes multiple stacked substantially identical semiconductor devices each including a first side and an opposing second side. First and second pads are disposed at the first side of the semiconductor device, while third and fourth pads are disposed at the second side of the semiconductor device. First interface circuit is electrically coupled to the first pad and the third pad, while second interface circuit is electrically coupled to the second pad and the fourth pad. The second interface circuit is separate and distinct from the first interface circuit. At least one first semiconductor device of the multiple semiconductor devices is offset from other of the multiple semiconductor devices such that the fourth pad on the first semiconductor device is aligned with, and electrically connected to, the first pad on an adjacent one of the multiple semiconductor devices. The semiconductor device assembly may be a multi-die memory chip, such as a multi-die DRAM chip, which may then be attached to a memory module, such as a DRAM memory module.

In some embodiments, the first side and the second side are substantially planar and parallel to one another. Also in some embodiments, the first and third pads are electrically coupled to each other by a first via through the semiconductor device, and the second and fourth pads are electrically coupled to each other by a second via through the semiconductor device. These vias may be through-silicon-vias (TSVs). In these embodiments, the first and third pads are aligned with one another along an axis substantially perpendicular to the first and second sides of the semiconductor device, and the second and fourth pads are aligned with one another along an axis substantially perpendicular to the first and second sides of the semiconductor device.

In use, and in the context of the semiconductor device being a memory device (such as a DRAM, an SRAM, a Flash memory IC, or other types of memory chip), the semiconductor device communicates data over an internal signal line to or from core interface circuit using either the first interface circuit or the second interface circuit depending on whether the first and third pads, or the second and fourth pads, are coupled to an external signal line. The core interface circuit may include, a data transmitter or a data receiver. The internal signal line is either unidirectional or bidirectional.

In some embodiments, the first interface circuit and the second interface circuit have different capacitances, e.g., the first interface circuit includes electrostatic discharge (ESD) circuitry. In other embodiments, the first interface circuit is a read channel master and the second interface circuit is a read channel slave, e.g., the first interface circuit is a write channel master and the second interface circuit is a write channel slave.

According to some embodiments there is provided a method for selectively enabling a mode of semiconductor device in a stacked semiconductor device assembly. Multiple semiconductor devices that are substantially identical to one another are provided, as described above. The multiple semiconductor devices are then stacked one on top of the other. Finally, at least a first semiconductor device of the multiple semiconductor devices is spatially offset from the remainder of the multiple semiconductor devices such that the fourth pad on the first semiconductor device is aligned with, and electrically connected to, the first pad on an adjacent one of the multiple semiconductor devices.

Finally, according to some embodiments there is provided a computing assembly that includes a bus; a processor coupled to the bus; communication circuitry coupled to the bus; semiconductor devices, as described above, forming multi-die memory chips that are coupled to the bus, where the multi-die memory chips include stacked semiconductors one on top of the other, and spatially offsetting at least a first semiconductor device of the multiple semiconductor devices from the remainder of the multiple semiconductor devices such that the fourth pad on the first semiconductor device is aligned with, and electrically connected to, the first pad on an adjacent one of the multiple semiconductor devices.

These embodiments provide a stacked semiconductor device assembly that allows for one or more semiconductor devices in the stack of identical semiconductor devices to have a different mode of operation to the remainder of the semiconductor devices in the stack.

Figure 1B:
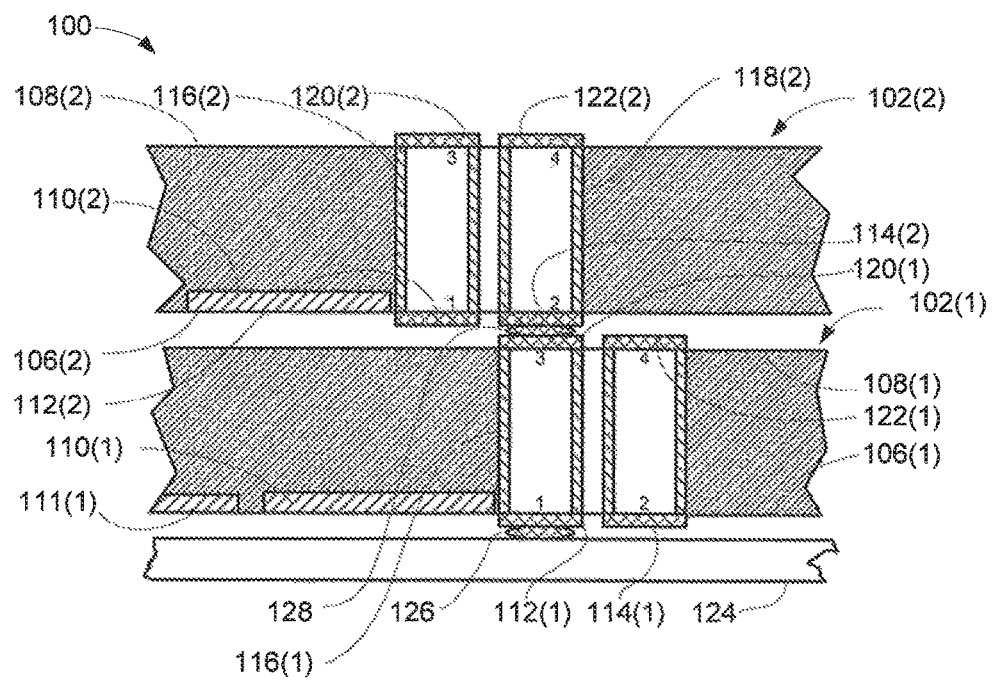
FIG. 1B is a cross sectional view of the stacked semiconductor device assembly shown in FIG. 1A, as viewed along line 1B-1B' of FIG. 1A.

FIG. 1A is a plan view of an exemplary stacked semiconductor device assembly 100, while FIG. 1B is a cross sectional view of the stacked semiconductor device assembly shown in FIG. 1A, as viewed along line 1B-1B' of FIG. 1A. The stacked semiconductor device assembly includes at least two semiconductor devices 102(1) and 102(2). In some embodiments, the semiconductor device is a die, i.e., an unpackaged bare integrated circuit or chip. In some of these embodiments, the semiconductor device is a memory die (e.g., DRAM, SRAM, Flash, RRAM, FeRAM, MRAM, etc.). In other embodiments, the semiconductor device is any packaged or unpackaged integrated circuit or the like. The stacked semiconductor device assembly 100 is particularly well suited to memory because of the needs for multiple substantially identical die that, in aggregate, satisfy the ever increasing demands on memory capacity and density.

The semiconductor devices 102(1), 102(2) are substantially identical to one another, so they can be fabricated using a same or substantially same set of semiconductor fabrication process steps. Each of the semiconductor devices 102(1), 102(2) has a substantially planar first side 106(1), 106(2) and an opposing substantially planar second side 108(1), 108(2). Each semiconductor device 102(1), 102(2) also includes active circuitry 110(1), 110(2), including interface circuit, modal select circuitry, core interface circuit, a core, and/or the like, as described below. In some embodiments, the active circuitry is formed near or at the first side 106(1), 106(2) of each semiconductor device.

Each of the semiconductor devices 102(1), 102(2) has a first group of connection pads 112(1), 112(2); a second group of connection pads 114(1), 114(2); a third group of connection pads 120(1), 120(2); and a fourth group of connection pads 122(1), 122(2). The connection pads on a semiconductor device are for connection circuits formed on the device to circuits external to the device. In one example, the connection pad may be input/output. (I/O) pads for connection to circuits external the assembly (e.g., other chips in the computer system). In another example, the connection pads may be contact pads for connecting to one or more intra-assembly buses. The connection pads may be of any suitable shape, such as square, round or the like. In some embodiments each group of connection pads is a stripe of connection pads that extend substantially across a respective side of each semiconductor device, i.e., each stripe may form a column (or row, depending on orientation) across a side of each semiconductor device. In some embodiments, each group of connection pads is located near the middle of a respective side of a semiconductor device, however, in other embodiments, the connection pads may be located near an edge or anywhere else on the semiconductor device. In other embodiments, each of the groups of connection pads may include multiple stripes of connection pads, e.g., each group includes two stripes of connection pads. In some embodiments, first group of connection pads 112(1), 112(2) and the second group of connection pads 114(1), 114(2) are disposed at the first surface 106(1), 106(2) of each of the respective semiconductor devices. Similarly, in some embodiments, the third group of connection pads 120(1), 120 (2) and the fourth group of connection pads 122(1), 122 (2) are disposed at the second surface 108(1), 108(2) of each of the respective semiconductor devices.

In some embodiments, each connection pad of the first group of connection pads 112 is aligned with and electrically connected to a corresponding connection pad of the third group of connection pads 120. Similarly, each connection pad of the second group of connection pads 114 is aligned with and electrically connected to a corresponding connection pad of the fourth group of connection pads 122. By aligned with it is meant that the connection pads are aligned along axes that are substantially perpendicular to both the first side 106 and the second side 108 of each semiconductor device (e.g., along axes parallel to a Z-axis perpendicular to both of the X and Y axes of FIG. 5). In some embodiments, the electrical connections between the connection pads of the first group of connection pads 112 and the connection pads of the third group of connection pads 120 is through a series of vias, two of which are shown by reference numerals 116(1), 116(2) (FIG. 1B) that extend through each semiconductor device from the connection pads at the first side 106 to the connection pads at the second side 108 of each of the respective semiconductor devices. Similarly, the electrical connections between the connection pads of the second group of connection pads 114 and the connection pads of the fourth group of connection pads 122 is also through a series of vias, one of which are shown by reference numerals 118(2) (FIG. 1B) that extend through each semiconductor device from the connection pads at the first side 106(1), 106(2) to the connection pads at the second side 108(1), 108(2) of each of the respective semiconductor devices. In other words, in some embodiments, each connection pad on the first side is connected to a corresponding pad at the second side through a single via.

In some embodiments, each of the vias may be referred to as a through chip via ("TCV") or through silicon via ("TSV"). Also in some embodiments, the vias 116 and 118 are substantially aligned with their respective pads along the axes defined above. The vim may be formed by any suitable technique, such as by thinning a wafer that contains a deep metal via formed during semiconductor processing, or by electroplating through-holes formed by laser drilling subsequent to semiconductor manufacturing, or by other techniques well known in the industry. In some embodiments (not shown), the vias are filled with a conductive material. In other embodiments, the electrical connections between the connection pads on the first side 106(1), 106(2) and the connection pads on the second side 108(1), 108(2) can be made through any other suitable electrical connections including traces, redistribution layers, different types and sizes of vias, leads, tape, wires, or any combination of the aforementioned.

As will be explained in more detail below, during assembly, the second semiconductor device 102(2) (typically an upper semiconductor device) is stacked adjacent to the first semiconductor device 102(1) (typically a bottommost semiconductor device) such that the second group of connection pads 114(2) of the second semiconductor device 102(2) is adjacent to and aligned with the third group of connection pads 120(1) of the first semiconductor device 102(1). Stated differently, the second semiconductor device is offset (stepped or moved along the X and/or Y axes of FIG. 5) from the first semiconductor device by a distance equal to an integer multiple of the pitch between the respective groups of connection pads (120 and 122, and/or 112 and 114) on each side of each semiconductor device. FIG. 2B illustrates an offset distance where the integer multiple is "1", but other values may be used. Each of the connection pads of the second group of connection pads 114(2) of the second semiconductor device 102(2) is then electrically connected to a corresponding connection pad of the third group of connection pads 120(1) of the first semiconductor device 102(1). These electrical connections are made by any suitable means, such as by a solder reflow process, as depicted by solder contact 128. Thermosonic flip chip bonding, thermocompression bonding, or other techniques common in multi-die bonding may also be used. In some embodiments, these electrical connections are made through "solder bumps", "micro-humps", or "C4 bumps" at each connection pad.

In some embodiments, the first semiconductor device 102(1) is electrically and/or mechanically connected to a package substrate 124, such as is used in flip-chip (FC) packaging. The FC package substrate is then usually electrically coupled to a printed circuit board (PCB) via a ball-grid array (BGA) connection technology (not shown). In particular, the connection pads of the first group of connection pads 112(1) on the first semiconductor device 102(1) are electrically connected to the substrate 124. In some embodiments, these electrical connections are made by any suitable means, such as by soldering connection pads to one another, as depicted by reference numeral 126. In some embodiments, these electrical connections are made through "solder bumps" or "C4 bumps" at each connection pad.

Once assembled, the stacked semiconductor device assembly 100 allows electrical signals to be communicated between electrical connections on the substrate 124 and those on the second semiconductor device 102(2) through the first semiconductor device 102(1). Here, the first semiconductor device 102(1) acts as the primary interface semiconductor device between the substrate 124 and the remainder of the semiconductor devices (here semiconductor device 102(2)) in the stacked semiconductor device assembly 100, and it may have active interface circuitry (e.g., ESD protection circuitry) that is different from the remainder of the semiconductor devices in the stack.

Figure 2A:
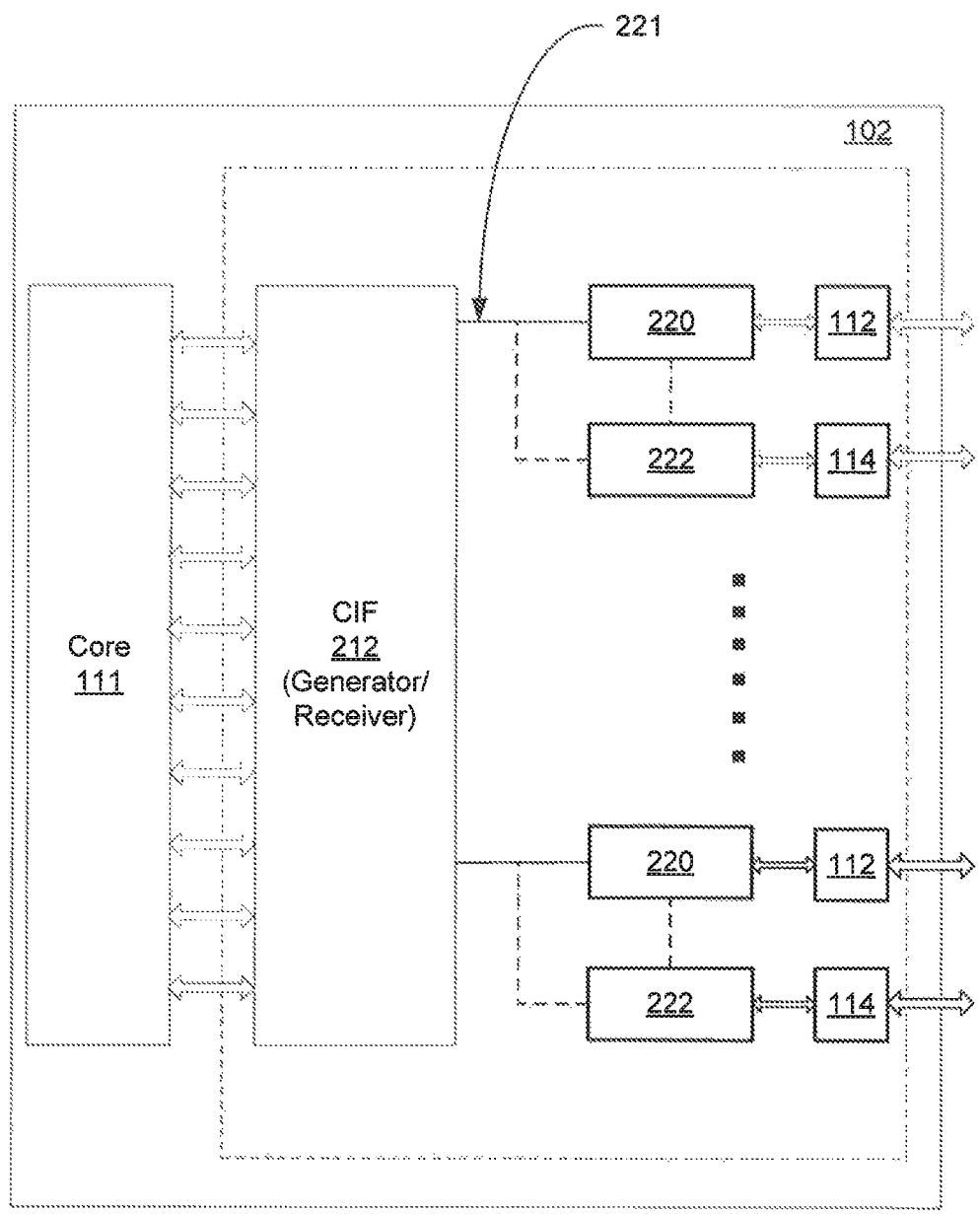
FIG. 2A is a schematic diagram of a semiconductor device in the stacked semiconductor device assembly shown in FIGS. 1A and 1B.
Figure 2B:
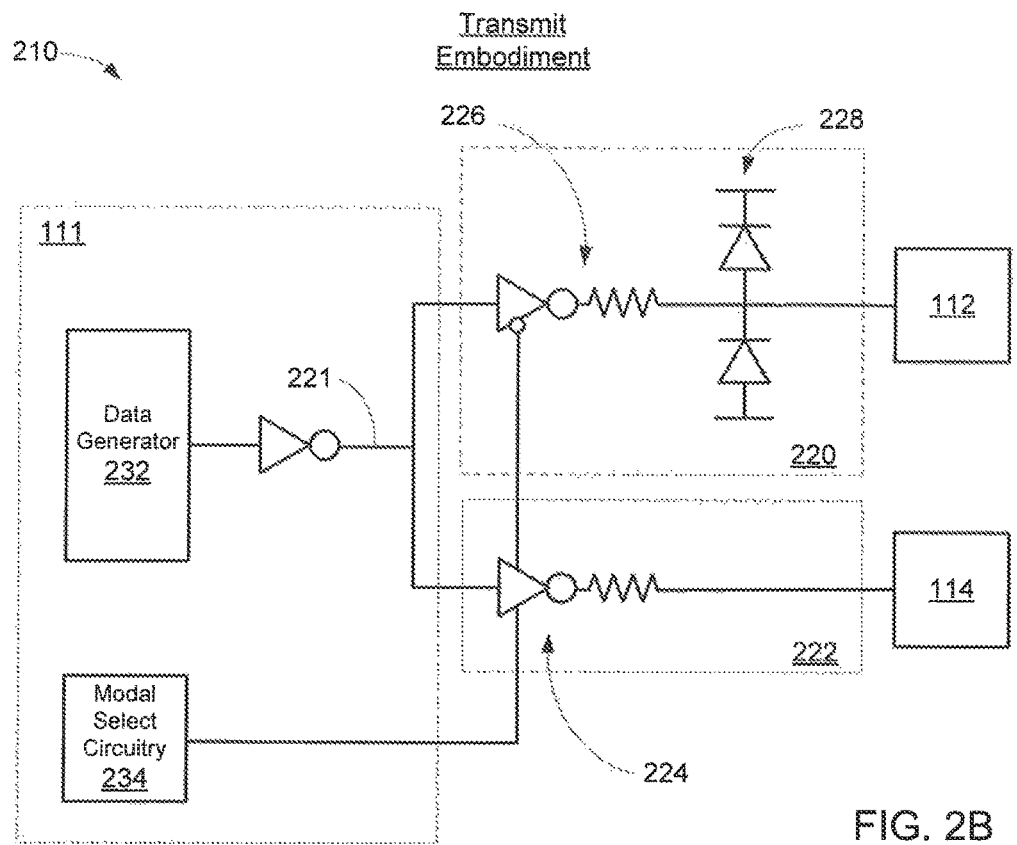
FIG. 2B is a schematic circuit diagram 210 of one embodiment of a portion of the semiconductor device shown in FIG. 2A.

FIG. 2A is a schematic diagram of a semiconductor device 102 in the stacked semiconductor device assembly shown in FIGS. 1A and 1B. The semiconductor device 102 shows a first connection pad 112 from the first group of connection pads 112(1), 112(2) of FIGS. 1A and 1B, and a second connection pad 114 from the second group of connection pads 114(1), 114(2) of FIGS. 1A and 1B.

The first connection pad 112 is electrically connected to first interface circuit 220, and the second connection pad 114 is electrically connected to second interface circuit 222.

In some embodiments, the first interface circuit 220 and the second interface circuit 222 electrically connect to a single signal path 221 made of, for example, a signal conducting line. This signal path 221 may be unidirectional or bidirectional. The signal line 221 is in turn electrically connected to core interface circuit 212, which may include a serializer or deserializer, and which may either generate and transmit signals to the signal line 221, or receive signals from the signal line 221. The core interface circuit 212 electrically connects to the core 111 (such as memory cells or memory banks) through multiple connections. The core 111 and core interface circuit 212, are well understood in the art.

The ability to access the core 111 via either the first connection pads 112 or the second connection pads 114 provides the designer of the stacked semiconductor device assembly the ability to have a particular semiconductor device in the stack operate in a different mode from the remainder of the semiconductor devices in the stacked semiconductor assembly, i.e., perform functional or electrical operations differently to other semiconductor devices in the stacked semiconductor assembly. The ability to have different modes of operation within a stacked semiconductor assembly is provided despite the stacked semiconductor assembly containing substantially identical semiconductor devices.

FIG. 2B is a schematic circuit diagram 210 of one embodiment of a portion of the semiconductor device shown in FIG. 2A. In this embodiment, interface circuits 220 and 222 include output drivers 226 and 224, respectively, for transmitting signals from the semiconductor device. One skilled in the art, however, will appreciate that a similar circuit may be included in interface circuits 226 or 224 for receiving signals into the semiconductor device. The first connection pad 112 connects to the first interface circuit 220, while the second connection pad. 114 connects to the second interface circuit 222. The first interface circuit 220 includes first driver 226 and ESD circuitry 228. The second interface circuit includes second driver 224. The first and second drivers 226, 224, respectively, electrically connect to the single signal line 221 that is in turn connected to a data generator 232, which forms part of the core interface circuit 212. The first and second driver circuitry 226, 224, respectively, also electrically connects to modal select circuitry 234, which may or may not form part of the core interface circuit 212. The modal select circuitry enables either the first driver 226 or the second driver 224. Suitable modal select circuitry is described in relation to FIG. 2E. In other embodiments, no modal select circuitry 234 is provided. In these embodiments, the desired circuitry or mode is enabled (e.g., powered-up, connected to an enable signal, connected to an output pad, etc.) by virtue of either making or not making a physical electrical connection at the interface semiconductor device.

In some embodiments, such as the embodiment described above in relation to FIG. 2B, the first interface circuit 220 has a first capacitance (C+), and the second interface circuit 222 has a second capacitance (C−) that is lower than the first capacitance. In some embodiments, these capacitances are representative of the aggregated capacitances of the active circuitry itself, the ESD circuitry 228, driver circuitry 224 or 226, the pad metal, and all electrical connections, such as traces etc., that are coupled to each of the connection pads 112 and 114. In use, the modal select circuitry can enable either the signal path through the first interface circuit 220 and the first connection pad 112, or the signal path through the second interface circuit 222 and the second connection pad 114.

Figure 2C:
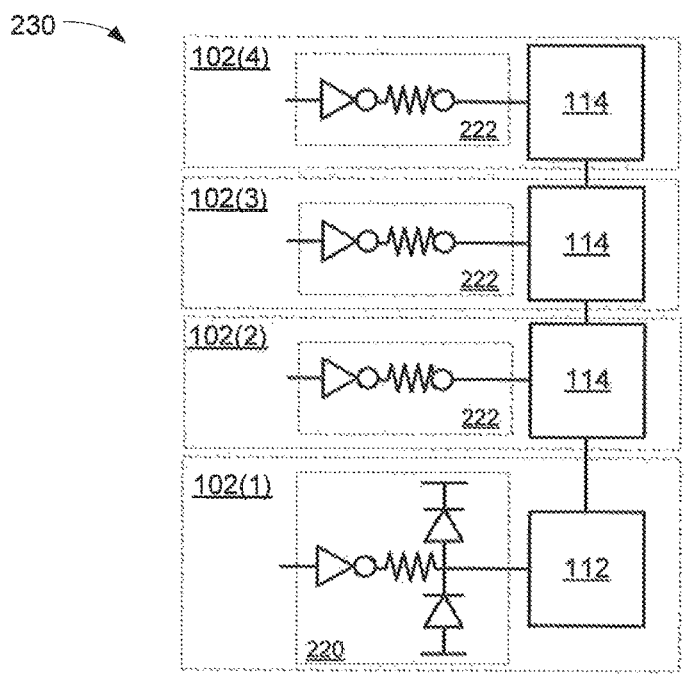
FIG. 2C is a schematic circuit diagram of a portion of a stacked semiconductor die assembly using devices like the one shown in FIG. 2B.

FIG. 2C is a schematic circuit diagram of a portion of a stacked semiconductor die assembly using devices like the one shown in FIG. 2B. By offsetting a semiconductor device, as described in relation to FIGS. 1A and 1B, and in some embodiments controlling the modal select circuitry 234, different semiconductor devices in the stacked semiconductor assembly operate in different modes. An interface semiconductor device 102(1) is offset (see FIG. 1B) from the remainder of the device in the stacked semiconductor assembly, so that the connection pad 112 and the interface circuit 220 is enabled. The connection pad 112 on the interface device 102(1) is connected to the connection pads 114 on the remainder of the semiconductor devices 102(2), 102(3), and 102(4) in the stacked semiconductor die assembly. The connections between the connection pads 112 and 114 may be through vias and other connection pads as described above in relation to FIGS. 1A and 1B. As the connection pad 112 and the first interface circuit 220 is enabled on the interface semiconductor device 102(1) (and not the second connection pad 114 and second interface circuit 222), the interface semiconductor device 102(2) operates in a different mode to the remainder of the semiconductor devices in the stacked semiconductor assembly. For example, the interface semiconductor device has the driver connected to ESD circuitry enabled, while the remainders of the devices in the stacked semiconductor assembly do not. In embodiments where no modal select circuitry 234 is provided, the first interface circuit 220 is used if the signal path is through the first connection pad 112, and the second interface circuit 222 is used if the signal path is through the second connection pad 114.

There are many advantages of the above described stacked semiconductor assembly. For example, as the higher capacitance is disabled for all except the interface device 102(1), the resulting capacitive loading on the external interface is drastically reduced, and, therefore, the overall performance of the stack is increased, as compared to an embodiment having identical semiconductor devices all having high capacitance loading. The above described embodiment also eliminates having to downsize the ESD protection circuitry in each of the semiconductor devices in the stack so that the overall aggregated ESD protection of the stack is at a desired level. Downsizing the ESD protection in each semiconductor device restricts the stack count to a number or amount of semiconductor devices that have a collective ESD protection amount. For example, if each semiconductor device has 500V HBM ESD tolerance, where the desired ESD protection amount of the stack is 2000V HBM, then no less than four semiconductor devices can be used in the stack. Instead, in the above described embodiments, the ESD protection circuitry is only enabled in the interface semiconductor device 102(1), thereby eliminating: (i) having to downsize the ESD protection circuitry in each of the semiconductor devices, and (ii) any restriction on the number of semiconductor devices that can be used in any one stacked semiconductor assembly. It should also not be overlooked that the stacked semiconductor assemblies described herein all make use of substantially identical semiconductor devices. This drastically reduces the complexity and cost of manufacturing and assembling such stacked semiconductor assemblies.

Figure 2D:
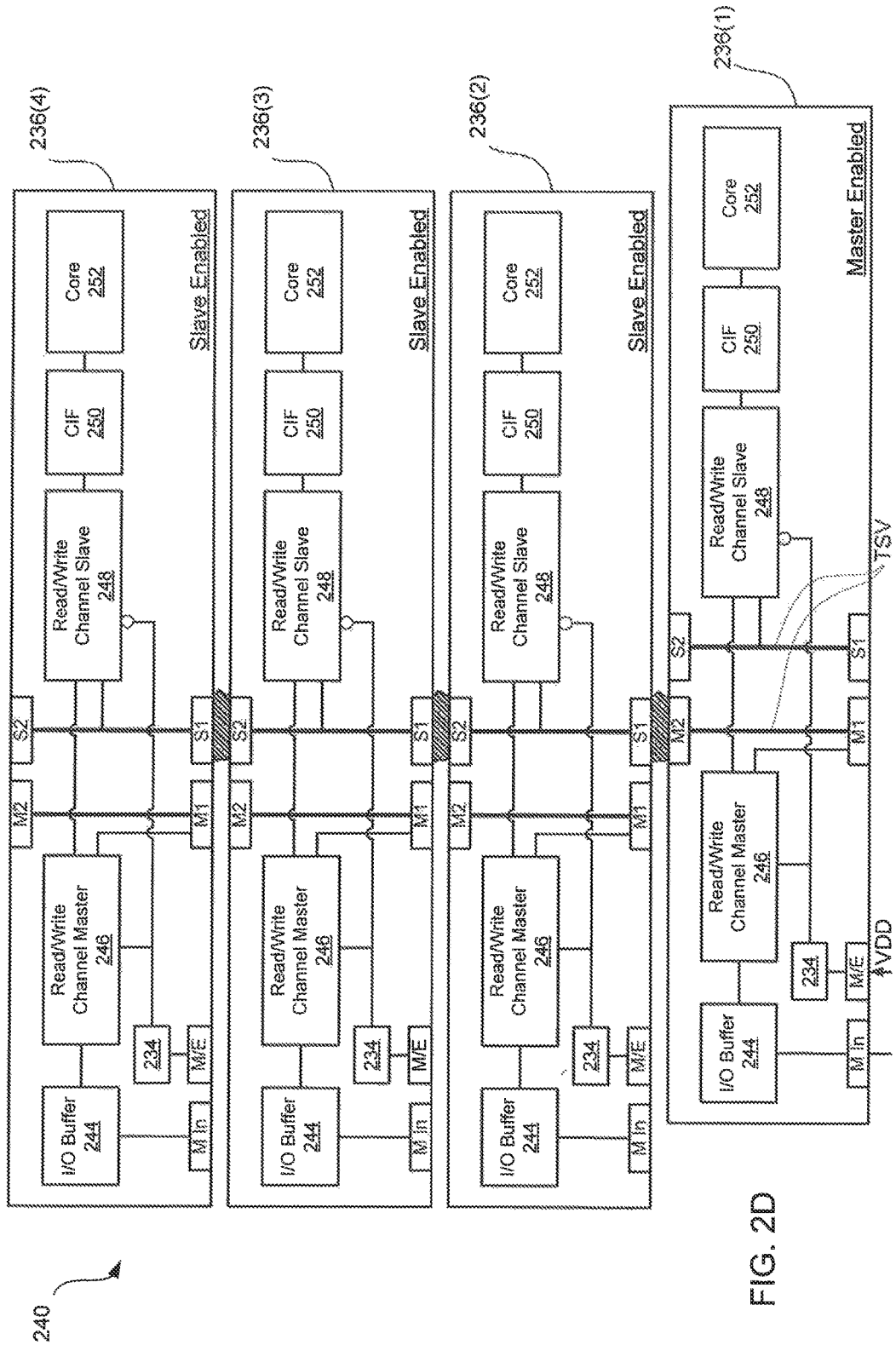
FIG. 2D is a schematic diagram of another stacked semiconductor die assembly with mode enable circuitry.

FIG. 2D is a schematic diagram of another stacked semiconductor device assembly 240 that includes a plurality of substantially identical semiconductor devices 236(1)-236(n), wherein the spatial offset technique is used to enable different modes of operation for the substantially identical semiconductor devices. Each of the semiconductor devices 236 includes a number of connection pads, including: a master-in connection pad (M In), a master enable connection pad (or mode enable or select connection pad, labeled a first master connection pad (M1), a second master connection pad (M2), a first slave connection pad (S1), and a second slave connection pad (S2). In some embodiments, the master-in connection pad (M in), master enable connection pad (M/E), first master connection pad (M1), and first slave connection pad (S1) are disposed at a first side of each semiconductor device, while the second master connection pad (M2) and the second slave connection pad (S2) are disposed at the second side of the semiconductor device. The first and the second sides are opposite to one another and may be substantially planar. The first master connection pad (M1) is connected to the second master connection pad (M2) through a via, such as a TSV. Similarly, the first slave connection pad (S2) is connected to the second slave connection pad (S2) through a via, such as a TSV.

In some embodiments, each semiconductor device 236 also includes circuitry, including: an I/O buffer 244 for receiving and buffering input signals received at the master in connection pad (M In); a read and/or write channel master circuit 246; a read and/or write channel slave circuit 248; a core interface circuit 250; a core 252 (e.g., a DRAM memory core, a flash memory core, a processor array core, etc.); and/or a mode select circuit 234. In some embodiments, the mode select circuit is located at or near the first side of each semiconductor device.

In some embodiments, the read and/or write channel master circuit 246 is electrically connected to the I/O buffer 244; the mode select circuitry 234; the first master connection pad (M1), which is in turn connected to the second master connection pad (M2) through a TSV; and the read and/or write channel slave circuit 248. In these embodiments, the read and/or write channel slave circuit 248 is electrically connected to the read and/or write channel master circuit 246; the core interface circuit 250; the first slave connection pad (S1), which is in turn connected to the second slave connection pad (S2) through a TSV; and/or mode select circuitry 234. The core interface circuit 250 is connected to the core 252.

In use, the first semiconductor device 236(1) can be spatially offset from the remainder of the semiconductor devices in the stack, such that the second master connection pad (M2) of the first semiconductor device 236(1) is connected to and aligned with the first slave connection pad (S1) of the second semiconductor device 236(2) in the stack. As with the embodiment described in FIGS. 1A and 1B, the second master connection pad (M2) is aligned with the first slave connection pad (S1) along an axis that is substantially perpendicular to the opposing two sides of the semiconductor device (i.e., along an axis substantially parallel to the Z-axis and substantially perpendicular to the X and Y axes of FIG. 5).

Figure 2E:
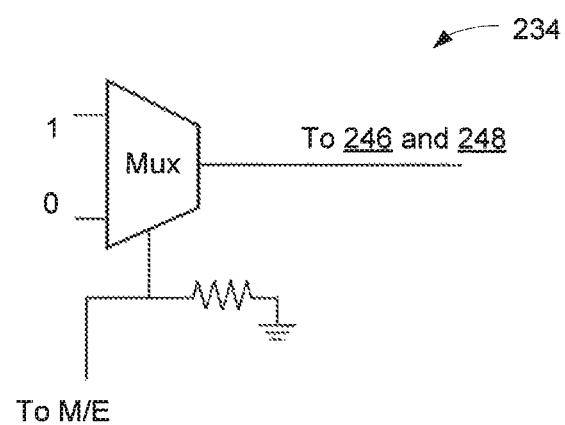
FIG. 2E is a schematic circuit diagram of the mode enable circuitry of FIG. 2D.

While any suitable mode enable or select circuitry 234 may be used, FIG. 2E demonstrates how a resistor to ground can provide the functionality of one such suitable circuitry. The schematic 234 includes a multiplexer (Mux) connected to inputs associated with, for example, data path (0) and data path (1). In this embodiment, the first path (0) is the default mode, while the second mode (1) is the mode enabled if the M/E signal is electrically attached to VDD.

In FIG. 2E, the select input of the Mux is connected to ground through a resistor. If the M/E signal pad is left unconnected, the resistor will "pull down" the select input to ground, thereby defaulting the Mux to the first mode (0). A similar technique can be used to create a global "Slave Enable" for the entire die. On the other hand, if a VDD connection is made to the master enable connection pad (M/E), the mode select signal will driven to VDD, thereby selecting the Mux to the second mode (1). A similar technique can be used to create a global "Master Enable" for the entire die. In other embodiments, separate mode select or enable circuitry may be provided for each of the read and/or write channel master circuit 246 (FIG. 2D) and the read and/or write channel slave circuit 248 (FIG. 2D).

Returning to FIG. 2D, a VDD signal is attached to the master enable connection pad (M/E) of the first semiconductor device 236(1) only, thereby enabling the read and/or write channel master circuit 246. The master enable connection pad (M/E) of the remainder of the semiconductor devices 236(2)-236(n) is not connected, thereby, enabling the default read and/or write channel slave circuit 248 on the remainder of the semiconductor devices 236(2)-(n).

In use, write signals received on the master-in connection pad (M In) are received and pass through the I/O buffer 244 to the read and/or write channel master circuit 246. Typically, a read interface of master circuit 246 includes data receivers, while a write interface of master circuit 246 includes data transmitters. The signal then passes from the read and/or write channel master circuit 246 to both the first master connection pad (M1), through the TSV to the second master connection pad (M2) and to the first slave connection pad (S2) on the adjacent semiconductor device. The signal also passes from the read and/or write channel master circuit 246 to the read and/or write channel slave circuit 248 of the same device, whereby it is passed onto the core interface circuit 250 and the core 252.

Write signals received at the second and subsequent semiconductor devices travel from the first slave connection pad (S1) to the second slave connection pad (S2) through a TSV and onto subsequent semiconductor devices in the stack. The signal also travels from the first slave connection pad (S1) of the second and subsequent devices 236(2)-(n) to the read and/or write channel slave circuit 248. The read and/or write channel slave circuit 248 may include read and/or write interfaces (not shown). The read interface of slave circuit 248 includes data transmitters, while the write interface of slave circuit 248 includes data receivers. In one embodiment, duplicate read and/write interfaces or duplicate transmitters and/or receivers may be provided in slave circuit 248 to communicate data with the master circuit 246 on the same device as the slave circuit 248 and the master circuit on another device, respectively. As shown in FIG. 2D, slave circuit 248 may also use the signal generated by select circuitry 234 to determine which of its receivers and/or transmitters need to be activated (i.e., whether it's interfacing with a master interface circuit 246 on the same die as itself or on another die in the stack). Finally, the signal travels from the read and/or write channel slave circuit 248 to the core interface circuit 250 and the core 252. Accordingly, by spatially offsetting the first of the substantially identical semiconductor devices in the stack, the first semiconductor device is master enabled, while the remainder of the devices in the stack are slave enabled. Additionally, transmitters in the stack's slave circuit 248 communicate to receivers in the bottom die's master circuit 246, while transmitters in the bottom die's master circuit 246 communicate to receivers in the stack's slave circuit 248.

Read signals should travel in opposite direction as the write signals. For example, a read signal originated from device 236(4) would travel from a read channel slave circuit 248 to the S1 pad of device 236(4), through the TSV's between pads S2 and S1 in devices 236(3) and 236(2), and through the TSV between pads M2 and M1 in device 236(1), to a read channel master circuit 246, and output by I/O buffer 244 through the "M In" pad of device 236(1).

Figure 3:
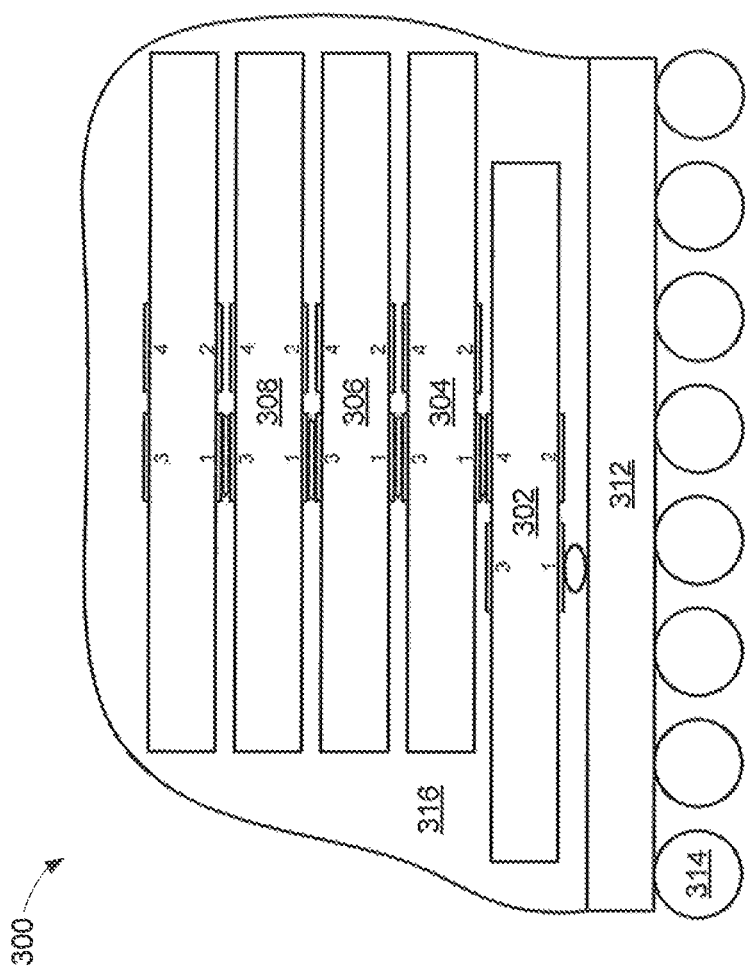
FIG. 3 is a schematic cross-sectional side view (cross-hatching removed for clarity) of another exemplary stacked semiconductor device assembly.

FIG. 3 is a schematic cross-sectional side view (cross-hatching removed for clarity) of another exemplary stacked semiconductor device assembly 300. As shown, the second group of connection pads of the interface semiconductor device (bottommost first semiconductor device) 302 is electrically connected (such as through "solder bumps" or "C4 bumps") to the substrate 312 of the stacked semiconductor device assembly 300. The fourth group of connection pads of the first semiconductor device 302 is then electrically coupled to the first group of connection pads of the second semiconductor device 304. The third group of connection pads of the second semiconductor device 304 is connected to the first group of connection pads of the third semiconductor device 306; the third group of connection pads of the third semiconductor device 306 is connected to the first group of connection pads of the fourth semiconductor device 308; and the third group of connection pads of the fourth semiconductor device 308 is connected to the first group of connection pads of the fifth semiconductor device 310. Overmolding 316 is them provided over the entire stack of semiconductor devices to insulate and protect the semiconductor devices. The stacked semiconductor device assembly may connect to other electronic circuitry via any suitable electrical connections, such as micro-BGA balls 314.

The stacked semiconductor device assembly allows any number of identical semiconductor devices to be stacked one on top of the other. Offsetting the bottom semiconductor device from the remainder of the semiconductor devices in the stack allows only the interface (or bottom) semiconductor device to perform functional or electrical operations differently as compared to the other semiconductor devices in the stack. For example, as shown in FIGS. 2B and 2C, only the connection pad on the interface semiconductor device is connected to ESD circuitry, where the ESD circuitry on the remainder of the semiconductor devices is not used or needed. In another example, as shown in FIG. 2D, the bottom die may act as a "stack Master", buffering IO data to multiple "stack Slaves" which are substantially identical but have disabled master IO portions.

As all of the semiconductor devices in the stack are connected to one another in series, in some embodiments, it is desirable to select a particular semiconductor device for receiving the transmitted signal. Selecting the appropriate semiconductor device may be achieved using any suitable chip select mechanism. One such suitable chip select mechanism is described in co-pending U.S. patent application Ser. No. 11/402,393, which is hereby incorporated by reference in its entirety.

Figure 4:
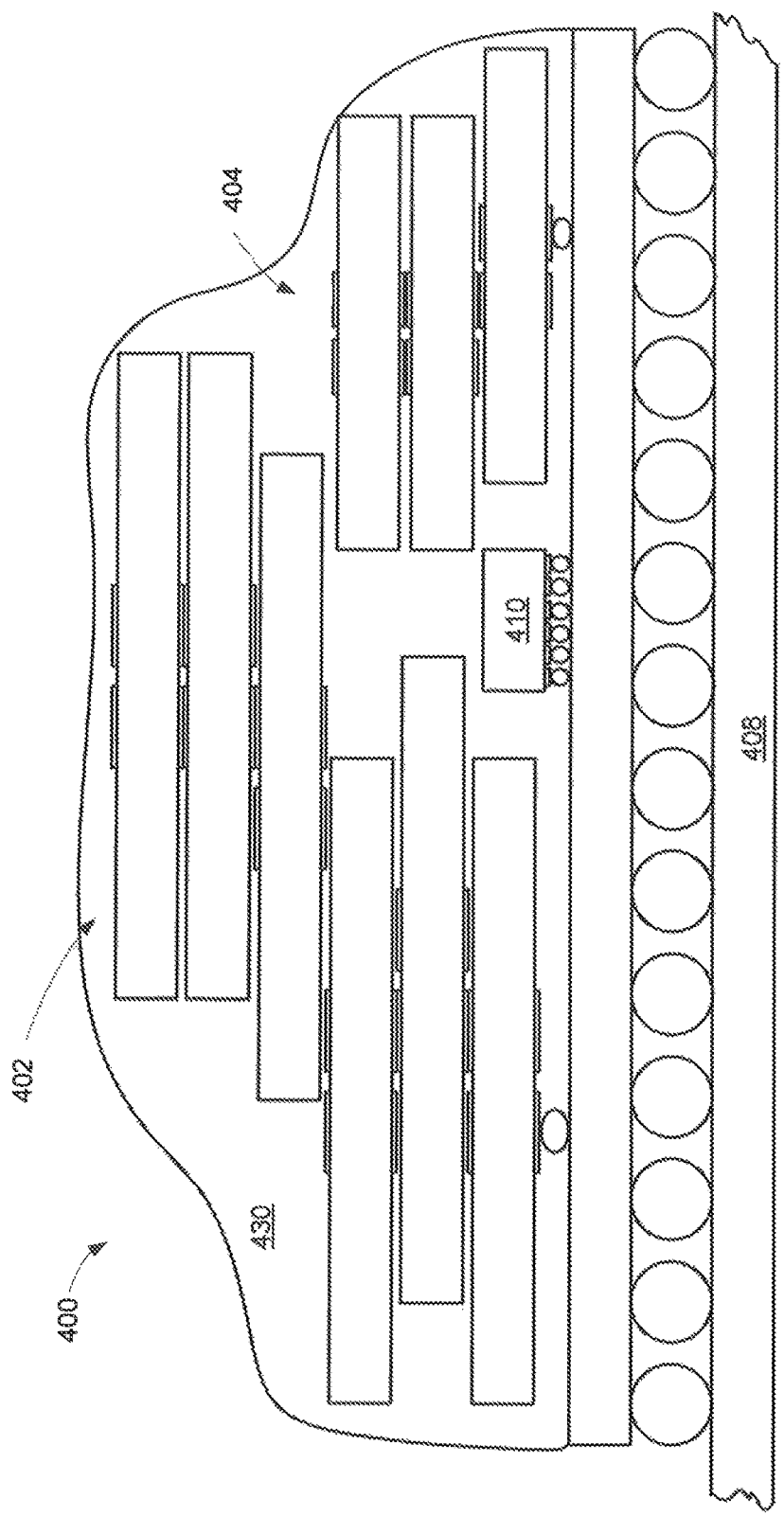
FIG. 4 is a schematic cross-sectional side view (cross-hatching removed for clarity) of another exemplary stacked semiconductor device assembly.

FIG. 4 is a schematic cross-sectional side view (cross-hatching removed for clarity) of another exemplary stacked semiconductor device assembly 400. This embodiment includes a stacked semiconductor device assembly connected to a circuit board 408. The stacked semiconductor device assembly 400 includes multiple stacks of semiconductor devices 402 and 404. One of the stacks of semiconductor devices 402 may include semiconductor devices that are offset in two opposing directions. The stacked semiconductor device assembly 400 may also include other circuitry 422 that is not stacked.

Figure 5:
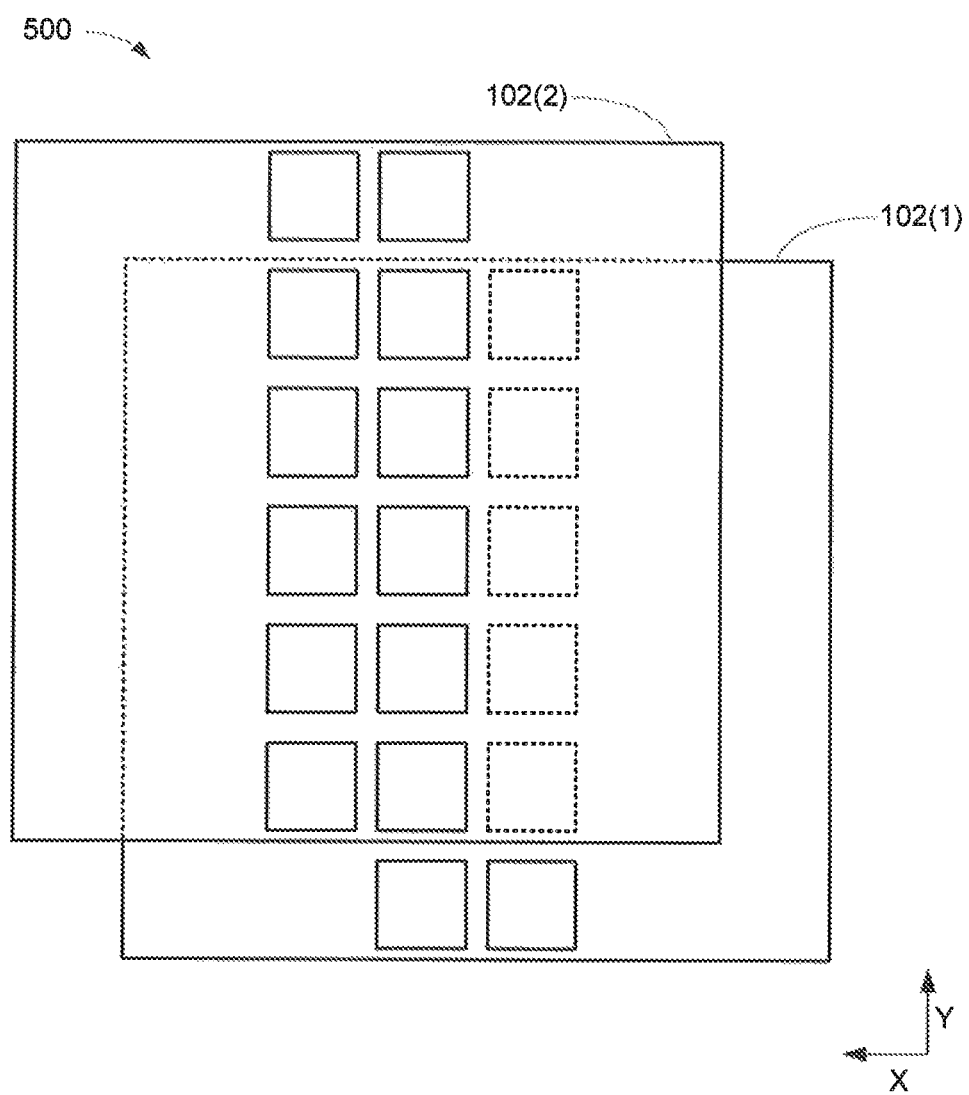
FIG. 5 is a plan view of another exemplary stacked semiconductor device assembly.

FIG. 5 is a plan view of another stacked semiconductor device assembly 500. Unlike the stacked semiconductor device assembly 100 shown in FIG. 1A, this stacked semiconductor device assembly 400 includes one or more semiconductor devices that are offset from one another in more than one dimension. For example, the uppermost semiconductor device 102(2) is offset from the bottommost semiconductor device 102(1) along both of the orthogonal axes Y and X.

Figure 6:
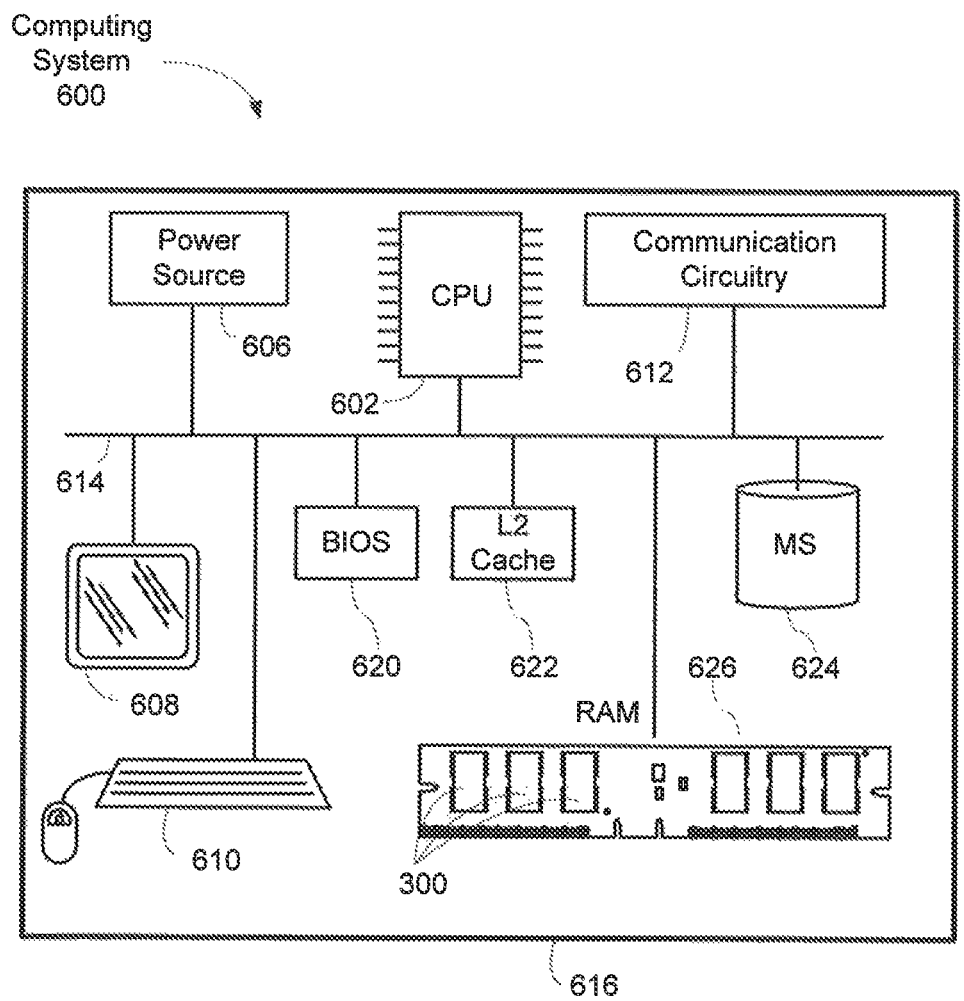
FIG. 6 is a schematic of a computer system using a stacked memory semiconductor device assembly.

FIG. 6 is a schematic of a computer system using a stacked memory semiconductor device assembly 626. The system 600 includes a plurality of components, such as at least one central processing unit (CPU) 602; a power source 606, such as a power transformer, power supply, or batteries; input and/or output devices, such as a keyboard and mouse 610 and a monitor 608; communication circuitry 612; a BIOS 620; a level two (L2) cache 622; Mass Storage (MS) 624, such as a hard-drive; Random Access Memory (RAM) 626; and at least one bus 614 that connects the aforementioned components. These components are at least partially housed within a housing 616. Some components may be consolidated together, such as the L2 cache 622 and the CPU 602. The RAM 626 includes one or more stacked semiconductor device assemblies 300 described above.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A stacked semiconductor device assembly, comprising:
first and second integrated circuit (IC) devices,
wherein the first IC device includes:
   a first master interface;
   a first channel master circuit coupled to the first master interface and configured to receive read/write data using the first master interface;
   a first slave interface;
   a first channel slave circuit coupled to the first slave interface and configured to receive read/write data using the first slave interface;
   a first memory core coupled to the first channel slave circuit via a first core interface; and
   a first modal pad;
wherein the second IC device includes:
   a second master interface;
   a second channel master circuit coupled to the second master interface and configured to receive read/write data using the second master interface;
   a second slave interface;
   a second channel slave circuit coupled to the second slave interface and configured to receive read/write data using the second slave interface;
   a second memory core coupled to the second channel slave circuit via a second core interface; and
   a second modal pad; and
wherein the first and second IC devices are configured such that in response to at least a modal selection signal received at one of the modal pads of the first and second IC devices, one of the first and second IC devices is configured to receive read/write data using its respective channel master circuit, and the other of the first and second IC devices is configured to receive read/write data using its respective channel slave circuit.

2. The stacked semiconductor device assembly of claim 1, wherein:

the modal selection signal includes a Master Enable signal applied on the first modal pad of the first IC device; and
in response to the Master Enable signal, the first IC device is configured to receive read/write data using the first channel master circuit, and the second IC device is configured to receive read/write data using the second channel slave circuit.

3. The stacked semiconductor device assembly of claim 2, wherein the second modal pad of the second IC device is left unconnected, or connected with a Slave Enable signal.

4. The stacked semiconductor device assembly of claim 1, wherein:
the modal selection signal includes a Slave Enable signal applied on the second modal pad of the second IC device; and
in response to the Slave Enable signal, the second IC device is configured to receive read/write data using the second channel slave circuit, and the first IC device is configured to receive read/write data using the first channel master circuit.

5. The stacked semiconductor device assembly of claim 4, wherein the first modal pad of the first IC device is left unconnected, or connected with a Master Enable signal.

6. The stacked semiconductor device assembly of claim 1, wherein the first and second IC devices are substantially identical, the first memory core is coupled to the first channel master circuit via the first channel slave circuit, and the second memory core is coupled to the second channel master circuit via the second channel slave circuit.

7. The stacked semiconductor device assembly of claim 1, wherein:
each of the first and second IC devices further comprises a first set of connection pads coupled to the respective channel master circuit and a second set of connection pads coupled to the respective channel slave circuit; and
the first channel master circuit of the first IC device is electrically coupled to the second channel slave circuit of the second IC device via at least one of the first set of connection pads of the first IC device and at least one of the second set of connection pads of the second IC device.

8. The stacked semiconductor device assembly of claim 7, wherein each set of the first and second sets of connection pads of the first IC device includes two connection pads that are associated with a through via and arranged on opposing sides of the first IC device, and each set of the first and second sets of connection pads of the second IC device includes two connection pads that are associated with a through via and arranged on opposing sides of the second IC device.

9. The stacked semiconductor device assembly of claim 1, wherein the first IC device is configured to communicate read/write data between the first memory core and the first channel master circuit, and to communicate read/write data between the first memory core and the first channel slave circuit, and the second IC device is configured to communicate read/write data between the second memory core and the second channel master circuit, and to communicate read/write data between the second memory core and the second channel slave circuit.

10. The stacked semiconductor device assembly of claim 9, wherein the stacked semiconductor device assembly is further configured to communicate data between the second memory core of the second IC device and the first channel master circuit of the first IC device by way of the second channel slave circuit of the second IC device.

11. The stacked semiconductor device assembly of claim 1, wherein the first memory core of the first IC device includes one of a DRAM memory core, a. flash memory core and a processor array core.

12. The stacked semiconductor device assembly of claim 1, wherein the first channel master circuit on the first IC device includes a first I/O pad connected to first electrostatic discharge (ESD) protection circuitry on the first IC device, and the second channel master circuit on the second IC device includes a second I/O pad connected to second electrostatic discharge (ESD) protection circuitry on the second IC device.

13. The stacked semiconductor device assembly of claim 12, wherein in accordance with an offset of the first and second IC devices, only the first ESD protection circuitry of the first IC device is enabled to reduce capacitive loading at the first I/O ad of the first channel master circuit of the first IC device.

14. The stacked semiconductor device assembly of claim 1, wherein the first channel slave circuit includes a first I/O pad that is not connected to first electrostatic discharge circuitry on the first IC device, and the second channel slave circuit includes a second I/O pad that is not connected to second electrostatic discharge circuitry on the second IC device.

15. The stacked semiconductor device assembly of claim 1, wherein the stacked semiconductor device assembly is a memory module, wherein the first channel master circuit includes a first read channel master, and the first channel slave circuit includes a first read channel slave, and wherein the second channel master circuit includes a second read channel master, and the second channel slave circuit includes a second read channel slave.

16. The stacked semiconductor device assembly of claim 1, wherein the stacked semiconductor device assembly is a memory module, wherein the first channel master circuit includes a first write channel master and the first channel slave circuit includes a first write channel slave, and wherein the second channel master circuit includes a second write channel master and the second channel slave circuit includes a second write channel slave.

17. The stacked semiconductor device assembly of claim 1, the first IC device further comprising first modal selection circuitry coupled to the first modal pad, the first channel master circuit and the first channel slave circuit of the first IC device, wherein the first modal selection circuitry is configured to enable one of the first channel master and slave circuits of the first IC device; and
the second IC device further comprising second modal selection circuitry coupled to the second modal pad, the second channel master circuit and the second channel slave circuit of the second IC device, wherein the second modal selection circuitry is configured to enable one of the second channel master and slave circuits of the second IC device.

18. The stacked semiconductor device assembly of claim 1, wherein the stacked semiconductor device assembly includes a DRAM module.

19. The stacked semiconductor device assembly of claim 1, wherein the stacked semiconductor device assembly includes multiple distinct groups of stacked IC devices.

20. The stacked semiconductor device assembly of claim 1, comprising:
a plurality of IC devices including a third IC device and a fourth IC device, wherein the third IC device is offset from the fourth IC device along two perpendicular axes that are substantially parallel with substantially planar sides of the plurality of IC devices.

21. A stacked semiconductor device assembly comprising:
   first and second integrated circuit (IC) devices,
   wherein the first IC device includes:
      a first master interface;
      a first channel master circuit coupled to the first master interface and configured to receive read/write data using the first master interface;
      a first slave interface;
      a first channel slave circuit coupled to the first slave interface and configured to receive read/write data using the first slave interface;
      a first memory core coupled to the first channel slave circuit via a first core interface; and
      a first modal pad;
   wherein the second IC device includes:
      a second master interface;
      a second channel master circuit coupled to the second master interface and configured to receive read/write data using the second master interface;
      a second slave interface;
      a second channel slave circuit coupled to the second slave interface and configured to receive read/write data using the second slave interface;
      a second memory core coupled to the second channel slave circuit via a second core interface; and
      a second modal pad; and
   wherein the first channel master circuit of the first IC device is configured to in response to at least a modal selection signal received at one of the modal pads of the first and second IC devices, receive write data signal using the first master interface and provide the write data signal to the second IC device.

22. A stacked semiconductor device assembly, comprising:
   first and second integrated circuit (IC) devices,
   wherein the first IC device includes:
      a first master interface;
      a first channel master circuit coupled to the first master interface and configured to receive read/write data using the first master interface;
      a first slave interface;
      a first channel slave circuit coupled to the first slave interface and configured to receive read/write data using the first slave interface;
      a first memory core coupled to the first channel slave circuit via a first core interface; and
      a first modal pad;
   wherein the second IC device includes:
      a second master interface;
      a second channel master circuit coupled to the second master interface and configured to receive read/write data using the second master interface;
      a second slave interface;
      a second channel slave circuit coupled to the second slave interface and configured to receive read/write data using the second slave interface;
      a second memory core coupled to the second channel slave circuit via a second core interface; and
      a second modal pad; and
   wherein the second channel slave circuit of the second IC device is configured to in response to at least a modal selection signal received at one of the modal pads of the first and second IC devices, receive write data signal from the first IC device using the second slave interface, and pass the write data signal to the second core interface and the second memory core of the second IC device.

* * * * *